United States Patent
Lee et al.

(10) Patent No.: US 9,904,593 B2
(45) Date of Patent: Feb. 27, 2018

(54) MEMORY DEVICE AND CORRECTION METHOD

(71) Applicant: TAIWAN SEMICONDUCTOR MANUFACTURING CO., LTD., Hsinchu (TW)

(72) Inventors: Chia-Fu Lee, Hsinchu County (TW); Yu-Der Chih, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 153 days.

(21) Appl. No.: 14/941,126

(22) Filed: Nov. 13, 2015

(65) Prior Publication Data

US 2017/0139770 A1 May 18, 2017

(51) Int. Cl.
| | |
|---|---|
| G06F 11/10 | (2006.01) |
| G11C 11/16 | (2006.01) |
| G11C 7/06 | (2006.01) |
| G11C 29/52 | (2006.01) |
| G11C 29/02 | (2006.01) |
| G11C 29/44 | (2006.01) |
| G11C 13/00 | (2006.01) |
| G11C 29/04 | (2006.01) |

(52) U.S. Cl.
CPC ...... G06F 11/1068 (2013.01); G06F 11/1048 (2013.01); G06F 11/1076 (2013.01); G11C 7/06 (2013.01); G11C 11/1673 (2013.01); G11C 13/004 (2013.01); G11C 29/021 (2013.01); G11C 29/022 (2013.01); G11C 29/026 (2013.01); G11C 29/44 (2013.01); G11C 29/52 (2013.01); G11C 2013/0054 (2013.01); G11C 2029/0409 (2013.01)

(58) Field of Classification Search
CPC ............ G06F 11/1068; G06F 11/1048; G06F 11/1076; G11C 29/52; G11C 7/06; G11C 29/021; G11C 29/022; G11C 29/026; G11C 29/44; G11C 2029/0409; G11C 13/004; G11C 11/1673; G11C 2013/0054
USPC ....... 714/764, 768, 769, 773, 774, 799, 819; 365/200, 201, 210.1, 210.12, 210.14
See application file for complete search history.

(56) References Cited

U.S. PATENT DOCUMENTS

| | | | | |
|---|---|---|---|---|
| 6,839,875 | B2 * | 1/2005 | Roohparvar | G06F 11/1072 714/773 |
| 8,077,520 | B1 * | 12/2011 | Yang | G11C 16/06 365/185.11 |
| 9,558,063 | B2 * | 1/2017 | Kajigaya | G06F 11/1048 |
| 2007/0016337 | A1 * | 1/2007 | Iwagami | B60R 16/03 701/1 |
| 2009/0172481 | A1 * | 7/2009 | Cornwell | G06F 11/1068 714/721 |
| 2014/0153332 | A1 * | 6/2014 | Parthasarathy | G11C 29/52 365/185.09 |

(Continued)

Primary Examiner — John J Tabone, Jr.
(74) Attorney, Agent, or Firm — Maschoff Brennan

(57) ABSTRACT

A device includes a reference circuit, a readout circuit, and an error correction coding circuit. The reference circuit is configured to generate a reference signal. The readout circuit is configured to generate data values of second data according to the reference signal and first data. The error correction coding circuit is configured to reset the reference circuit when errors occur in all of the data values of the second data.

20 Claims, 8 Drawing Sheets

(56) References Cited

U.S. PATENT DOCUMENTS

| | | | | |
|---|---|---|---|---|
| 2014/0185361 A1* | 7/2014 | Oh | ................ | G11C 13/004 |
| | | | | 365/148 |
| 2015/0074493 A1* | 3/2015 | Kajigaya | ............. | G06F 11/1048 |
| | | | | 714/764 |
| 2015/0318033 A1* | 11/2015 | Kajigaya | ............. | G11C 11/1673 |
| | | | | 714/764 |
| 2017/0117044 A1* | 4/2017 | Kajigaya | ............. | G11C 13/0069 |

\* cited by examiner

MEMORY DEVICE AND CORRECTION METHOD

BACKGROUND

With rapid development of manufacturing process technology, high speed memory devices have been widely utilized in many applications. As the speed of data transmission is getting faster, data errors would occur during the transmission progress. In some situations, the data errors in the data stored in the memory devices are able to be corrected by employing an error correction code. In some other situations, the data errors occur due to fault in internal circuits, which include, for example, reference circuits, of the memory devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
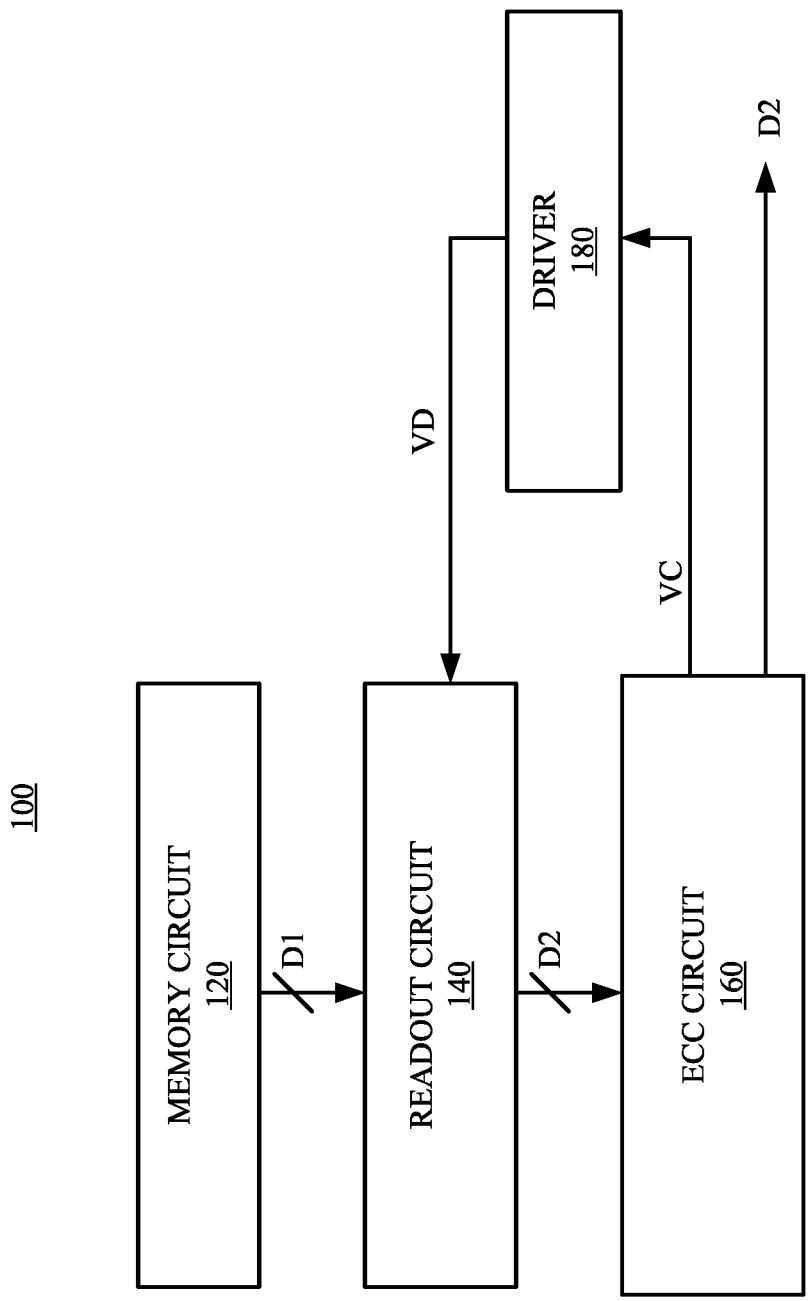
FIG. 1A is a schematic diagram of a device, in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Reference is now made to FIG. 1A. FIG. 1A is a schematic diagram of a device 100, in accordance with various embodiments of the present disclosure. In some embodiments, the device 100 is implemented as a memory device.

As illustratively shown in FIG. 1A, the device 100 includes a memory circuit 120, a readout circuit 140, an error correction coding (ECC) circuit 160, and a driver 180. The memory circuit 120 includes memory arrays, which are, for example, illustrated as the memory array 122 in FIG. 2 below. The memory circuit 120 is configured to send data values of data D1, in parallel, to the readout circuit 140. The readout circuit 140 is coupled to the memory circuit 120 to receive the data values of the data D1. The readout circuit 140 is configured to generate data values of data D2 according to the data values of the data D1 and at least one reference signal which is, for example, illustrated as the reference signal REF in FIG. 2 below.

The ECC circuit 160 is coupled to the readout circuit 140 and the driver 180. In some embodiments, the ECC circuit 160 is configured to detect whether data errors occur in the data values of the data D2, and then correct the date values, having the data errors, of the data D2. In some embodiments, the ECC circuit 160 is implemented with various types of digital circuits. In further embodiments, the digital circuits include an encoder that is able to correct one or more of the data values, having the data errors, of the data D2. In other words, in some embodiments, when the data errors occur in one or more of the data values of the data D2, the ECC circuit 160 is configured to correct the one or two of the data values, having the data error, of the data D2.

The configurations of the ECC circuit 160 are given for illustrative purposes only. Various configurations of the ECC circuit 160 are within the contemplated scope of the present disclosure.

Figure 1B:
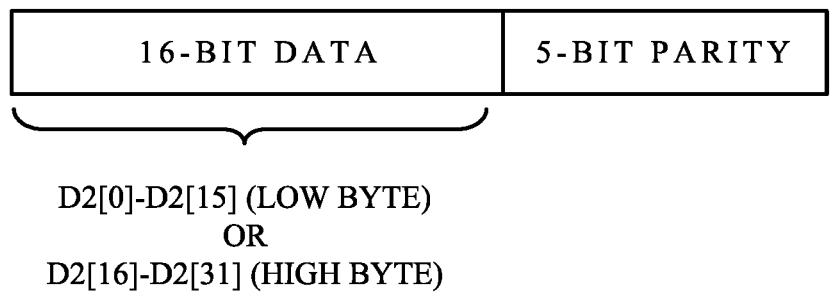
FIG. 1B is a schematic diagram illustrating an example of correcting 1-bit of the data D2 by the ECC circuit in FIG. 1A, in accordance with some embodiments of the present disclosure.

FIG. 1B is a schematic diagram illustrating an example of correcting 1-bit of the data D2 by the ECC circuit 160 in FIG. 1A, in accordance with some embodiments of the present disclosure.

Figure 2:
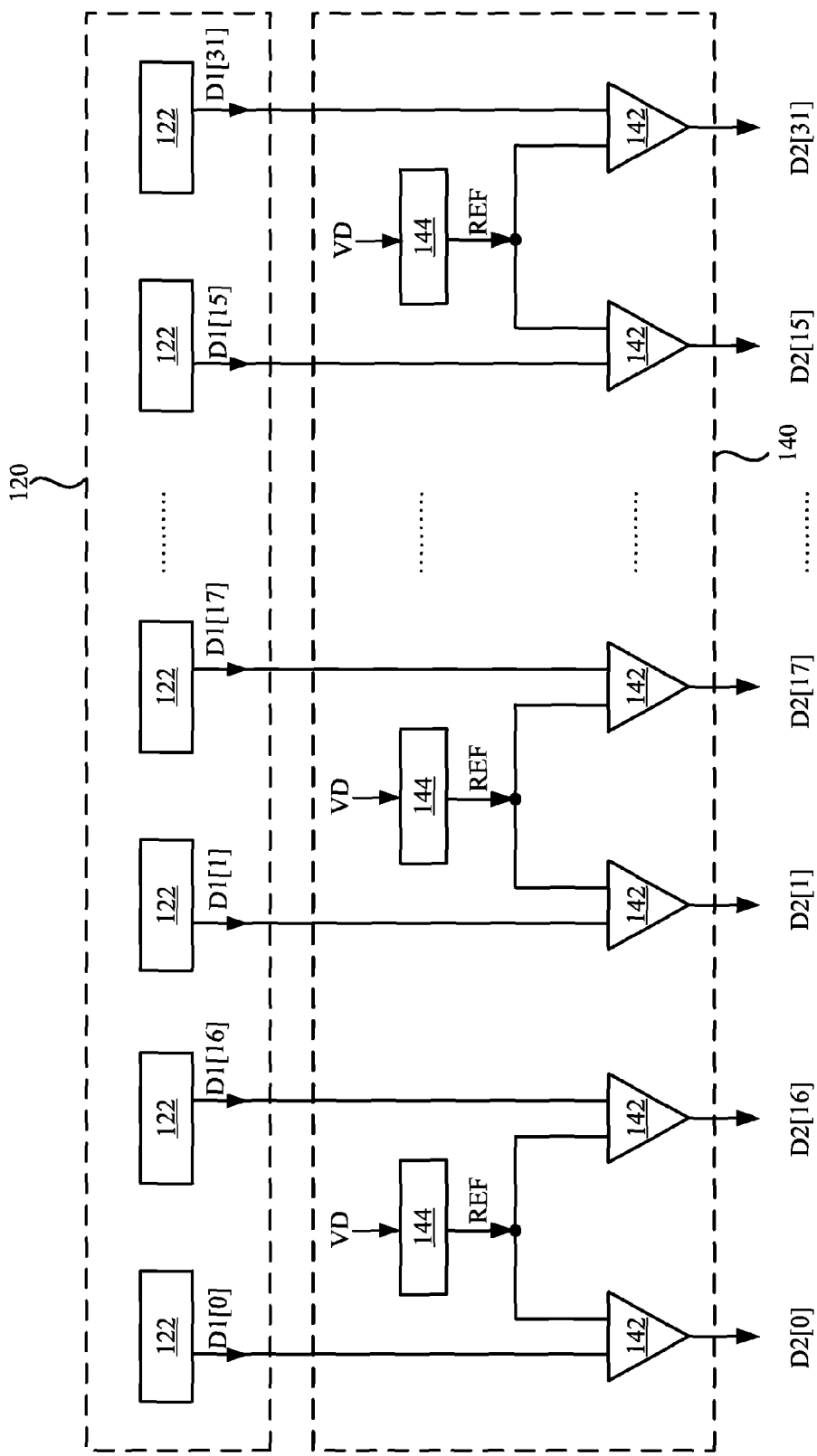
FIG. 2 is a schematic diagram illustrating an arrangement between the memory circuit in FIG. 1A and the readout circuit in FIG. 1A, in accordance with some embodiments of the present disclosure.

In some embodiments, the data D1 and the data D2 are multi-bit signals. For example, the data D2 is a 32-bit signal. The 32 bits of the data D2 correspond to a data value D2[0], a data value D2[1], . . . , a data value D2[31], as illustrated in FIG. 2 below, respectively. In some embodiments, the 32 bits of the data D2 are divided into a low byte and a high byte. Each of the low byte and the high byte include 16 bits of the data D2. For example, the low byte includes the data values D2[0]-D2[15], and the high byte includes the data value D2[16]-D2[31]. In some embodiments illustrated in FIG. 1B, when an data error occurs in one bit of the high byte or the low byte, the ECC circuit 160 is configured to add parity bits to the high byte or the low byte, in order to correct the one bit, having the data error, of the high byte or the low byte. In some embodiments, the number of the parity bits, added by the ECC circuit 160, is sufficient to allow the ECC circuit 160 to correct the data error in the low byte or the high byte. For illustration of FIG. 1B, in some embodiments, when 1-bit data error occurs in a 16-bit data, which is, for example, the high byte or the low byte, 5-bit parity are added to the 16-bit data for correcting the one bit data error. The number of the bytes of the data D2 is given for illustrative purposes only. Various numbers of the bytes of the data D2 are within the contemplated scoped of the present disclosure.

Figure 1C:
FIG. 1C is a schematic diagram illustrating an example of correcting 2-bit of the data D2 by the ECC circuit in FIG. 1A, in accordance with some other embodiments of the present disclosure.

FIG. 1C is a schematic diagram illustrating an example of correcting 2-bit of the data D2 by the ECC circuit 160 in FIG. 1A, in accordance with some other embodiments of the present disclosure. Alternatively, in some other embodiments, when 2-bit data errors occur in a 32-bit data, which is, for example, the data D2, 12-bit parity are added to the 32-bit data for correcting the 2-bit data error.

The number of the bits of the data D2 and the number of the parity bits are given for illustrative purposes only. Various numbers of the bits of the data D2 and various numbers of the parity bits are within the contemplated scope of the present disclosure.

With continued reference to FIG. 1A, in some embodiments, the ECC circuit 160 is configured to generate a control signal VC when the data errors occur at least two of the data values of the data D2. The driver 180 is configured to drive the readout circuit 140 according to the control signal VC. In some embodiments, the driver 180 is configured to transmit at least one predetermined voltage VD to the readout circuit 140 according to the control signal VC. The readout circuit 140 is able to be written by the at least one predetermined voltage VD to generate the aforementioned reference signals REF.

Reference is now made to FIG. 2. FIG. 2 is a schematic diagram illustrating an arrangement between the memory circuit 120 in FIG. 1A and the readout circuit 140 in FIG. 1A, in accordance with some embodiments of the present disclosure.

As described above, the memory circuit 122 sends the data values of the data D1 to the readout circuit 140. For illustration of FIG. 2, the data D1 is the 32-bit signal that includes data values D1[0]-D1[31], and the data D2 is the 32-bit signal that includes the data values D2[0]-D2[31]. In some embodiments, the memory circuit 120 includes memory arrays 122. The memory arrays 122 are configured to send the data values D1[0]-D1[31] of the data D1 to the readout circuit 140 during a read operation. In some embodiments, each of the memory arrays 122 includes memory cells that are disposed in rows and columns, and data lines coupled each of the memory cells for transmitting one of the data values D1[0]-D1[31]. In further embodiments, the memory cells are able to be implemented with various types of memory devices.

The readout circuit 140 includes sense amplifiers 142 and reference circuits 144. The sense amplifiers 142 are configured to generate the data values D2[0]-D2[31] of the data D2 according to the data values D1[0]-D1[31] of the data D1 and reference signals REF.

The reference circuits 144 are configured to generate the reference signals REF. In some embodiments, the circuit architecture of the reference circuits 144 is a replica of a part of memory array 122. For example, in some embodiments, the reference circuit 144 includes reference bit lines, reference memory cells, and a signal averaging circuit. The reference bit lines are coupled to the reference memory cells, and to be written the at least one predetermined voltage VD. At least one of the reference memory cells is configured to have data being at a high logic state according to the at least one predetermined voltage VD, and at least one of the reference memory cells is configured to data being at a low logic state according to the at least one predetermined voltage VD. The signal averaging circuit is able to generate the reference signal REF according to data stored in the reference memory cells. The arrangement of the reference circuit 144 is given for illustrative purposes only. Various arrangements of the reference circuit 144 are within the contemplated scoped of the present disclosure. For example, in some alternative embodiments, the circuit architecture of the reference circuits 144 is a replica of the entire memory array 122.

In some embodiments, each of the reference circuits 144 is configured to provide the reference signal REF to two or more sense amplifiers 142. In other words, each of the reference circuits 144 is shared by two or more sense amplifiers 144. As described above, in some embodiments, the low byte of the data D2 is configured to have 16 bits that sequentially correspond to the data values D2[0]-D2[15]. The high byte of the data D2 is configured to have 16 bits that sequentially correspond to the data values D2[16]-D[31]. As shown in FIG. 2, the first bit, i.e., the data value D2[0], of the low byte and the first bit, i.e., the data value D2[16], of the high byte are generated according the same reference signal REF. The second bit, i.e., the data value D2[1], of the low byte and the second bit, i.e., the data value D2[17], of the high byte are generated according the same reference signal REF. With this analogy, the data values D2[0]-D2[31] are able to be generated.

With such arrangements, when data errors occur in the two of the data values D2[0]-D2[31], which are generated according to the same reference signal REF, an error is considered to occur in the corresponding to the reference circuit 144. The corresponding reference circuit 144 is then reset by the driver 180, in order to prevent the data errors from occurring in the same data values again. As a result, the data accuracy and the reliability of the device 100 are able to be improved. Detailed operations of correcting the data errors and resetting the reference circuit 144 are described with reference to FIG. 3 below.

The number of bits of the data D2 is given for illustrative purposes only. Various numbers of the bits of the data D2 are within the contemplated scope of the present disclosure.

In some approaches, in order to prevent two-bit data error from occurring in the data, each data values of the data is generated according to different reference signals. In other words, in such approaches, each of the reference circuits is coupled to one sense amplifier, instead of being shared by two or more sense amplifiers. Compared with such approaches, with the arrangements illustrated in FIG. 2, the power consumption, during the read operation, of the device 100 is reduced, and the circuit area of the device 100 is saved.

Figure 3A:
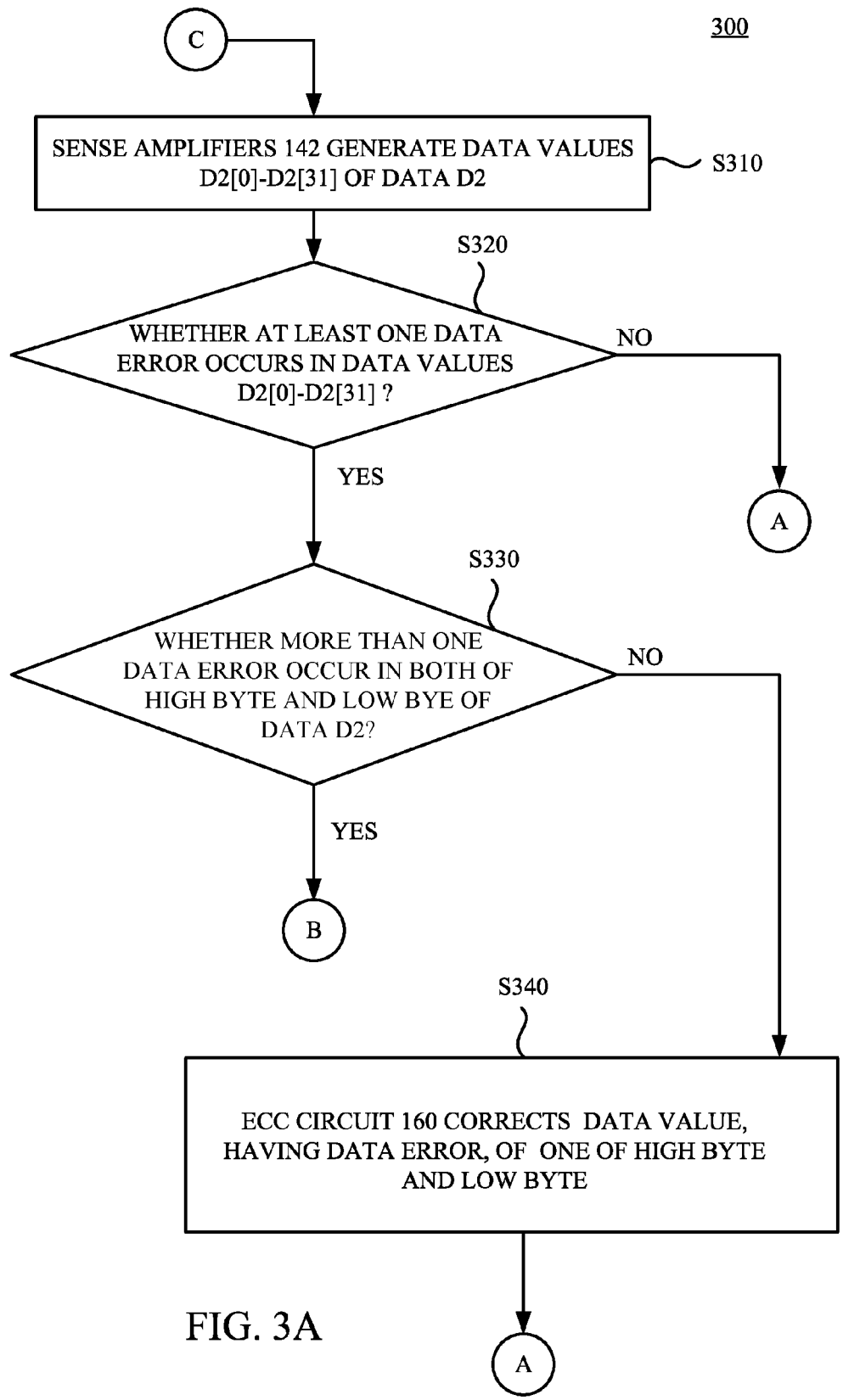
FIGS. 3A-3B illustrate a flow chart of a method, in accordance with some embodiments of the present disclosure.
Figure 3B:
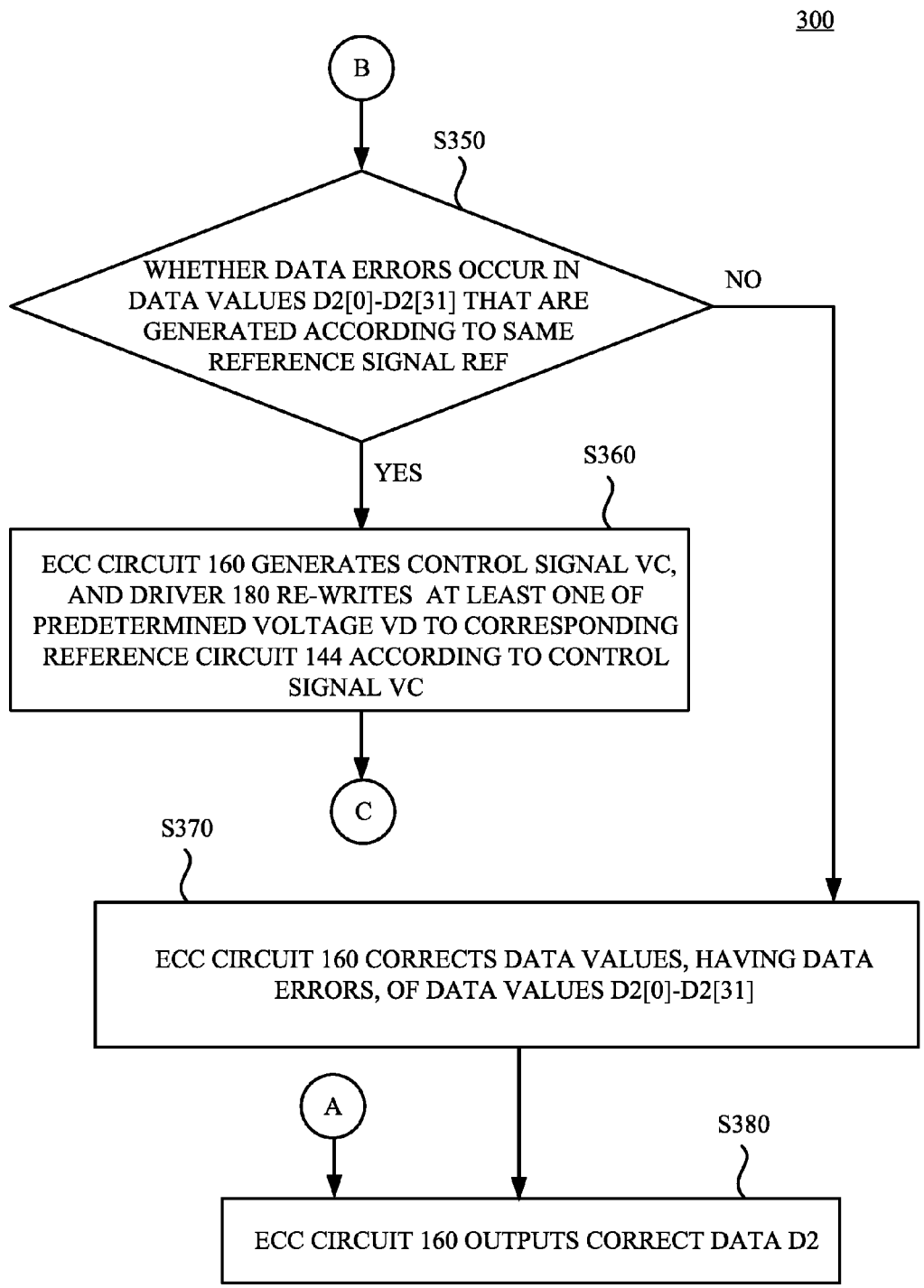

FIGS. 3A-3B illustrate a flow chart of a method 300, in accordance with some embodiments of the present disclosure. The operations of the device 100 in FIG. 1A are described with reference to FIG. 2 and FIGS. 3A-3B. In some embodiments, the method 300 includes operations S310-S380.

In operation S310, the sense amplifiers 142 generate the data values D2[0]-D2[31] of the data D2 during a read operation. Effectively, the data D1 stored in the memory arrays 122 are read via the sense amplifiers 142.

In operation S320, the ECC circuit 160 determines whether at least one data error occurs in the data values D2[0]-D2[31] of the data D2. If at least one data error occurs in the data values D2[0]-D2[31], operation S330 is performed. Otherwise, operation S380 is performed.

In operation S330, the ECC circuit 160 further determines whether more than one data error occur in both of the high byte and the low byte of the data D2. If only one data error occurs in one data values of one of the high byte and the low byte, operation S340 is performed. Otherwise, operation S350 is performed.

In operation S340, the ECC circuit 160 corrects the data value, having the data error, of the one of the high byte and the low byte. For example, when the ECC circuit 160 detects that only one data error occurs in the data value D2[0], i.e., the first bit of the low byte, the ECC circuit 160 then corrects the data value D2[0].

In operation S350, the ECC circuit 160 further determines whether the data errors occur in the data values D2[0]-D2[31] that are generated according to the same reference signal REF. If yes, operation S360 is performed. Otherwise, operation S370 is performed. In operation S360, the ECC circuit 160 generates the control signal VC, and the driver 180 re-writes the at least one predetermined voltage VD to the corresponding reference circuit 144 according to the control signal VC. After operation S360 is performed, operation S310 is then performed again, in order to generate the correct data D2.

In some embodiments, when the ECC circuit 160 detects that a data error occurs in one of the data values D2[0]-D2[15] of the low byte, and another data error occurs in one of the data values D2[16]-D2[31] of the high byte, the ECC circuit 160 then determines whether the one, having the data error, of the data values D2[0]-D2[15] and the one, having the data error, of the data values D2[16]-D2[31] are generated according to the same reference signal REF. For example, the ECC circuit 160 detects that the data errors occur in the data values D2[0] and D2[16]. As described in FIG. 2, the data values D2[0] and D2[16] are generated according to the same reference signal REF. Accordingly, the ECC circuit 160 then generates the control signal VC to the driver 180. The driver 180 then re-writes the predetermined voltage VD, according to the control signal VC, to the corresponding reference circuit 144. Effectively, the corresponding reference circuit 144 is thus reset to generate the correct reference signal REF. After the corresponding reference circuit 144 is reset, the readout circuit 120 then reads the data D1 stored in the memory arrays 122, in order to output the correct data D2.

In operation S370, the ECC circuit 160 corrects the data values, having the data errors, of the data values D2[0]-D2[31]. For example, the data error occurs in the data value D2[0] of the low byte, and another data error occurs in the data value D2[17] of the high byte. Under this circumstance, the ECC circuit 160 corrects the data values D2[0] and D2[17]. Alternatively, in some alternative examples, the data errors occur in the data values D2[0]-D2[1] of the low byte, the ECC circuit 160 then corrects them to generate the correct data D2.

In operation S380, the ECC circuit 160 outputs the correct data D2. Accordingly, the reliability and the data accuracy of the device 100 are improved.

The above description includes exemplary operations, but the operations of the method 300 are not necessarily performed in the order described. The order of the operations disclosed in the method 300 are able to be changed, or the operations are able to be executed simultaneously or partially simultaneously as appropriate, in accordance with the spirit and scope of various embodiments of the present disclosure.

Figure 4:
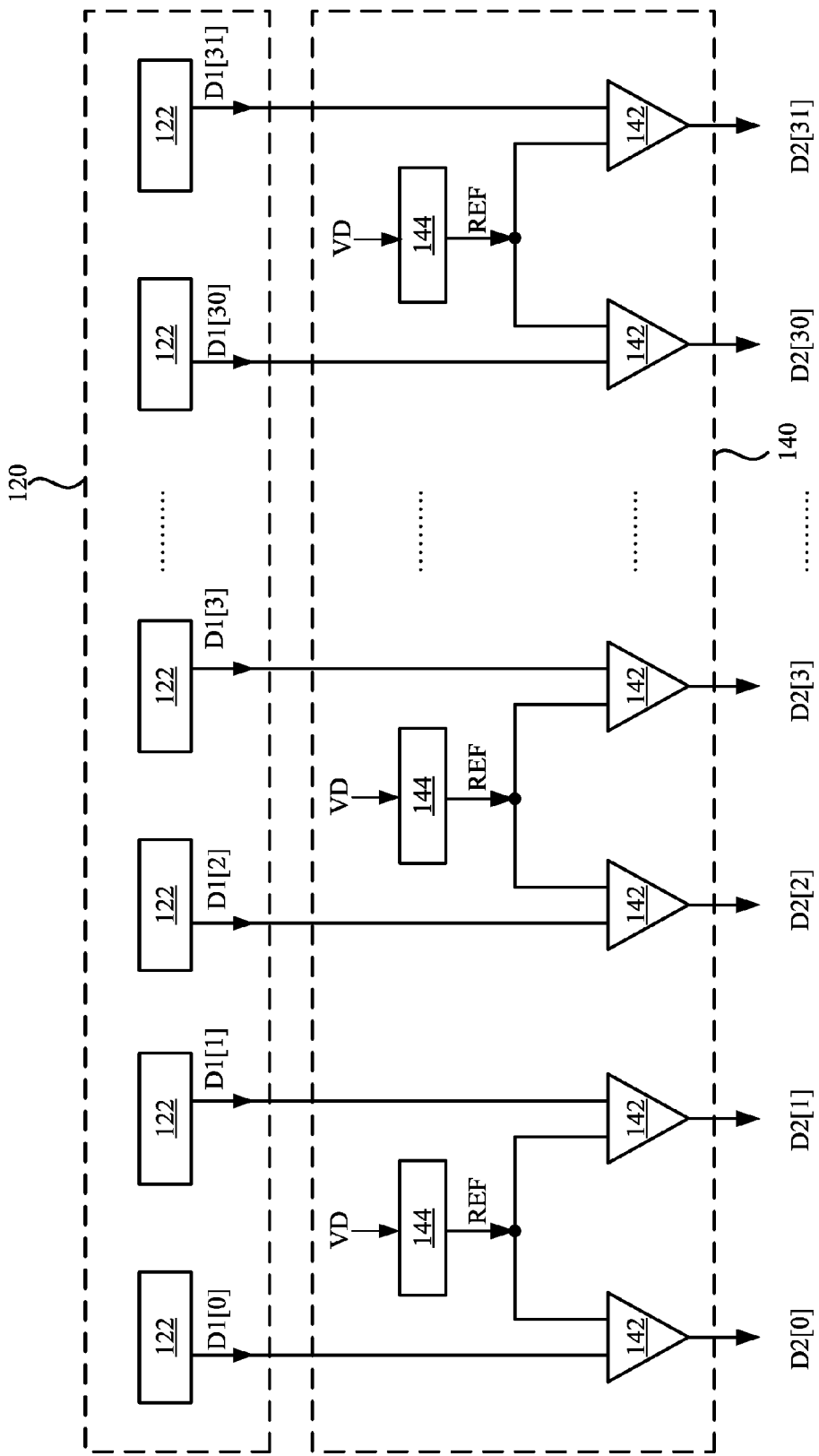
FIG. 4 is a schematic diagram illustrating an arrangement between the memory circuit in FIG. 1A and the readout circuit in FIG. 1A, in accordance with some alternative embodiments of the present disclosure.

Reference is now made to FIG. 4. FIG. 4 is a schematic diagram illustrating an arrangement between the memory circuit 120 in FIG. 1A and the readout circuit 140 in FIG. 1A, in accordance with some alternative embodiments of the present disclosure.

Compared with the arrangement in FIG. 2, in some other embodiments illustrated in FIG. 4, at least two successive data values D2[0]-D2[31] are configured to be generated according to the same reference signal REF. For illustration of FIG. 4, the data values D2[0] and D2[1] are generated according to the same reference signal REF. The data values D2[2] and D2[3] are generated according to the same reference signal REF. With this analogy, the data values D2[0]-D2[31] are able to generated.

With such arrangements, when data errors occur in the two successive bits of the data values D2[0]-D2[31], which are generated according to the same reference signal REF, an error is considered to occur in the corresponding to the reference circuit 144. Thus, the driver 180 resets the corresponding reference circuit 144, in order to prevent the data errors from occurring in the same data values again. As a result, the data accuracy and the reliability of the device 100 are improved. Detailed operations of correcting the data errors are described with reference to FIGS. 5A-5B below.

The number of the successive bits of the data values D2[0]-D2[31], which are generated according to the same reference signal REF, is given for illustrative purposes only. Various numbers of the successive bits of the data values D2[0]-D2[31], which are generated according to the same reference signal REF, are within the contemplated scope of the present disclosure. For example, in some other embodiments, the data values D2[0]-D2[2] are generated according one of the reference signals REF, and the data values D2[3]-D2[5] are generated according other one of the reference signals REF.

Figure 5A:
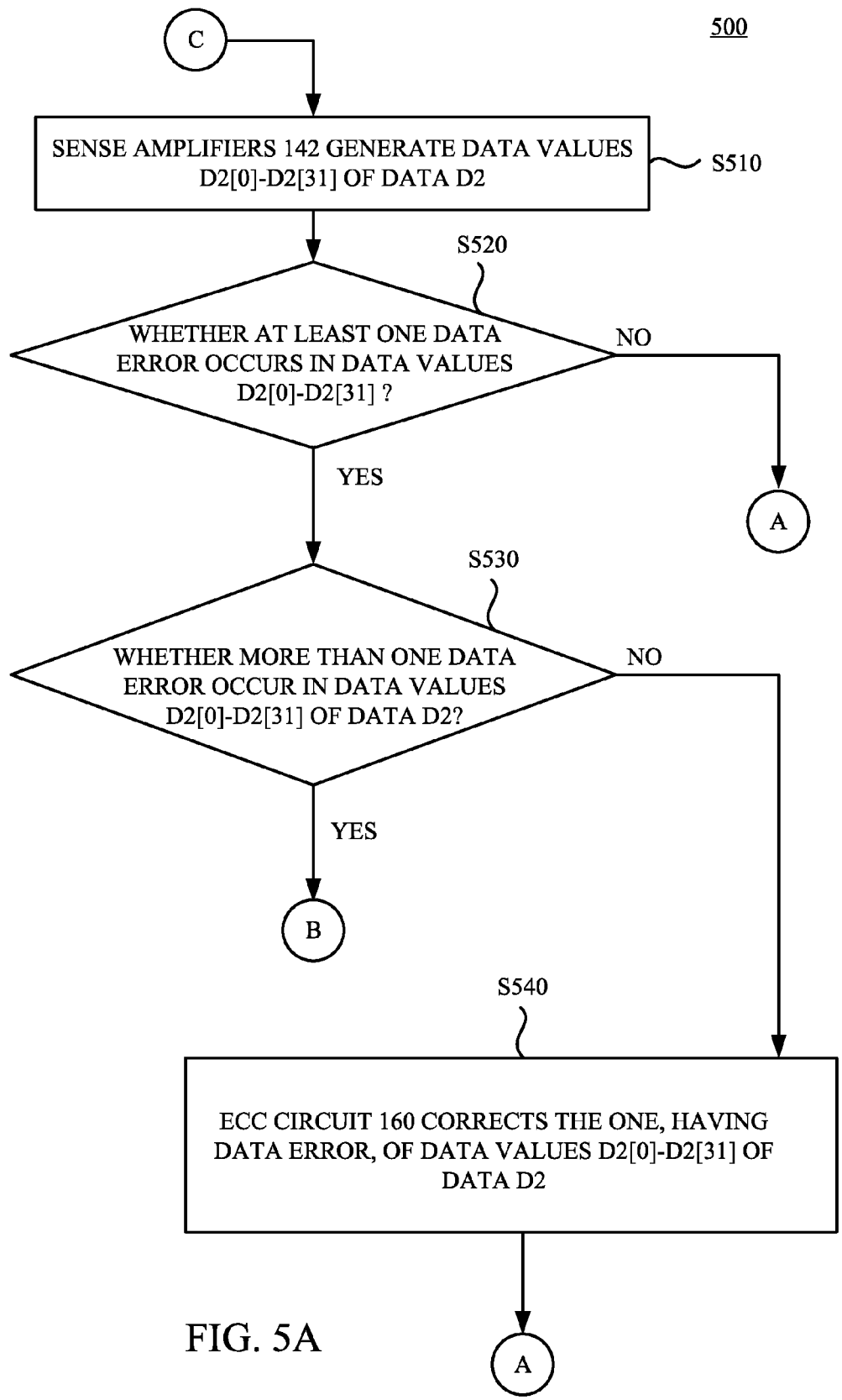
FIGS. 5A-5B illustrate a flow chart of a method, in accordance with the some alternative embodiments of the present disclosure.
Figure 5B:
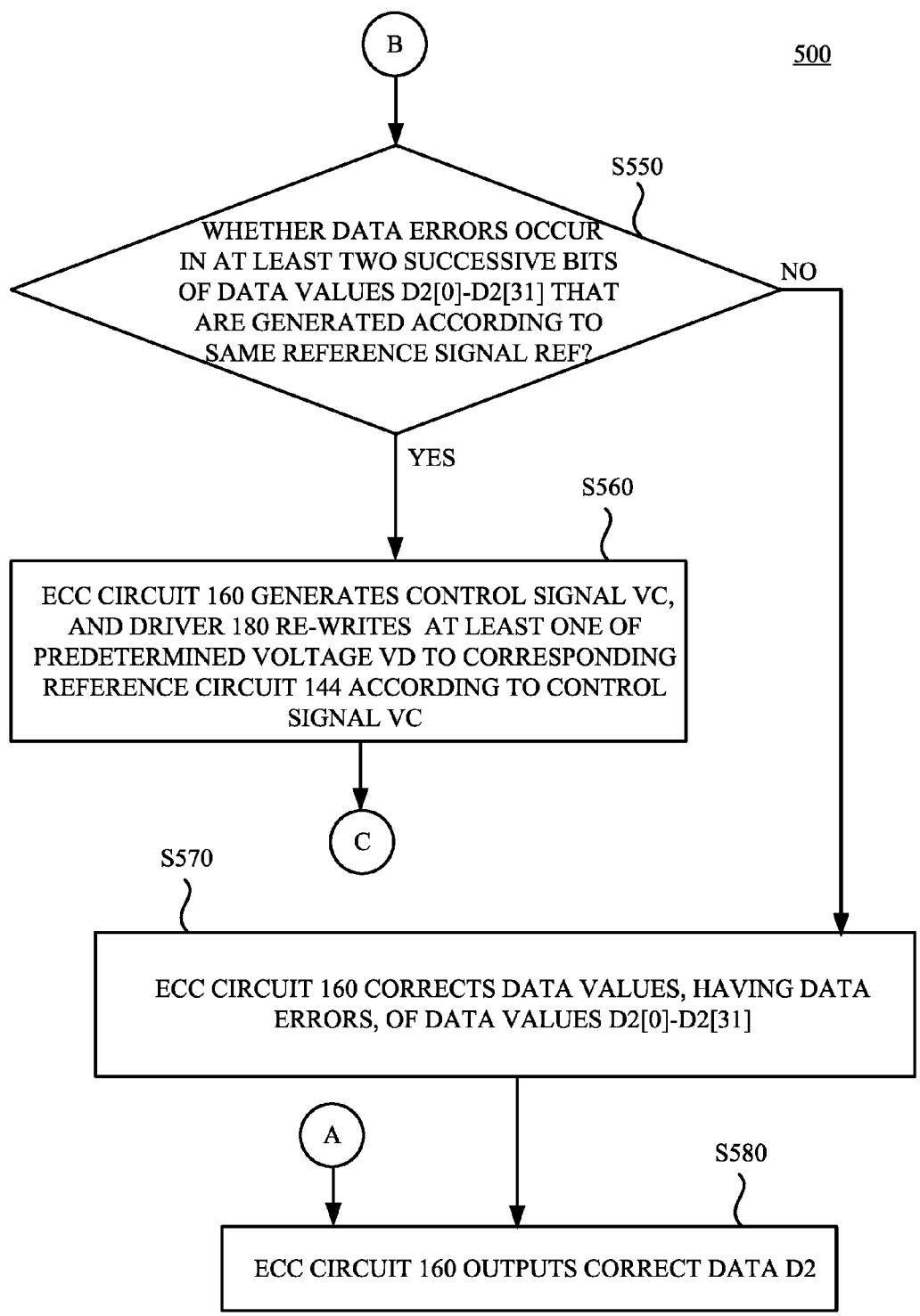

FIGS. 5A-5B illustrate a flow chart of a method 500, in accordance with the some alternative embodiments of the present disclosure. The operations of the device 100 in FIG. 1A are described with reference to FIG. 4 and FIGS. 5A-5B. In some embodiments, the method 500 includes operations S510-S580.

In operation S510, the sense amplifiers 142 generate the data values D2[0]-D2[31] of the data D2 during a read operation. Accordingly, the data values D1[0]-D1[31] of the data D1 stored in the memory arrays 122 are read.

In operation S520, the ECC circuit 160 determines whether at least one data error occurs in the data values D2[0]-D2[31] of the data D2. If at least one data error occurs in the data values D2[0]-D2[31], operation S530 is performed. Otherwise, operation S580 is performed.

In operation S530, the ECC circuit 160 further determines whether more than one data error occur in the data values D2[0]-D2[31] of the data D2. If only one data error occurs in one of the data values D2[0]-D2[31] of the data D2, operation S540 is performed. Otherwise, operation S550 is performed.

In operation S540, the ECC circuit 160 corrects the one, having the data error, of the data values D2[0]-D2[31] of the data D2. For example, when the ECC circuit 160 detects that only one data error occurs in the data value D2[0], the ECC circuit 160 then corrects the data value D2[0], in order to output the correct data D2.

In operation S550, the ECC circuit 160 further determines whether the data errors occur in at least two successive bits of the data values D2[0]-D2[31] that are generated according to the same reference signal REF. If yes, operation S560 is performed. Otherwise, operation S570 is performed. In operation S560, the ECC circuit 160 generates the control signal VC, and the driver 180 re-writes the at least one of the predetermined voltage VD to the corresponding reference circuit 144 according to the control signal VC. After operation S560 is performed, operation S510 is performed to generate the correct data D2.

In some embodiments, when the ECC circuit 160 detects that at least two data errors occur in at least two successive bits of the data values D2[0]-D2[31] of the data D2. The ECC circuit 160 then determines whether the at least two bits, having the data errors, of the data values D2[0]-D2[31], which are generated according the same reference signal REF, of the data D2. For example, the ECC circuit 160 detects that the data errors occur in the two successive data values D2[0] and D2[1]. As described in FIG. 4, the two successive data values D2[0] and D2[1] are generated according to the same reference signal REF. Accordingly, the ECC circuit 160 then generates the control signal VC to the driver 180. The driver 180 thus re-writes the predetermined voltage VD, according to the control signal VC, to the corresponding reference circuit 144. Effectively, the corresponding reference circuit 144 is able to be reset, in order to generate the correct reference signal REF. After the corresponding reference circuit 144 is reset, the readout circuit 120 then reads the data D1 stored in the memory arrays 122, in order to output the correct data D2.

In operation S570, the ECC circuit 160 corrects the data values, having the data errors, of the data values D2[0]-D2[31]. In some embodiments, the data errors occur in the two bits of the data values D2[0]-D2[31], that are generated according to different reference signals REF, of the data D2. Under this condition, the ECC circuit will correct the two bits of the data values D2[0]-D2[31], in order to output the correct data D2. For example, the data errors occur in the data values D2[0] and D2[31]. As illustrated in FIG. 4, the data values D2[0] and D2[31] are generated according the different reference signals REF, and the ECC circuit 160 thus corrects the data values D2[0] and D2[31], in order to output the correct data D2.

In operation S580, the ECC circuit 160 outputs the correct data D2. Accordingly, the reliability and the data accuracy of the device 100 are able to be improved.

The above description of the method 500 includes exemplary operations, but the operations of the method 500 are not necessarily performed in the order described. The order of the operations of the method 500 disclosed in the present disclosure are able to be changed, or the operations are able to be executed simultaneously or partially simultaneously as appropriate, in accordance with the spirit and scope of various embodiments of the present disclosure.

The operations described above, which are illustrated with the correction of the data errors occurring in two bits of the data values D2[0]-D2[31], are given for illustrative purposes only. Various numbers of the bits, which are able to be corrected by the ECC circuit 160, are within the contemplated scope of the present disclosure.

As described above, the device 100 in the present disclosure is able to detect whether the reference circuits in a memory system are faulted. Moreover, the device 100 in the present disclosure is also able to reset the faulted reference circuits in real-time, in order to correct the data errors in the outputted data. Accordingly, the data accuracy and the reliability of the device 100 are improved.

In this document, the term "coupled" may also be termed as "electrically coupled," and the term "connected" may be termed as "electrically connected". "Coupled" and "connected" may also be used to indicate that two or more elements cooperate or interact with each other.

In some embodiments, a device is disclosed that includes a reference circuit, a readout circuit, and an error correction coding circuit. The reference circuit is configured to generate a reference signal. The readout circuit is configured to generate data values of second data according to the reference signal and first data. The error correction coding circuit is configured to reset the reference circuit when errors occur in all of the data values of the second data.

Also disclosed is a device that includes a reference circuit, a first sense amplifier, a second sense amplifier, an error correction coding circuit, and a driver. The reference circuit is configured to be written by at least one predetermined voltage, to generate a reference signal. The first sense amplifier is coupled to a first memory array to receive a first data value of first data, and configured to generate a first data value of second data according to the first data value of the first data and the reference signal. The second sense amplifier is coupled to a second memory array to receive a second data value of first data, and configured to generate a second data value of the second data according to the second data value of the first data and the reference signal. The error correction coding circuit is configured to generate a control signal when errors occur in both of the first data value and the second data value of the second data. The driver is configured to re-write the at least one predetermined voltage to the reference circuit according to the control signal.

Also disclosed is a method that includes the operation below. A reference signal is generated by a reference circuit. A first data value and a second value of second data are generated by a readout circuit according to first data and the reference signal. A control signal is generated by an error correction circuit when errors occur in both of the first data value and the second data value of the second data. The reference circuit is reset by a driver according to the control signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A device, comprising:
a driver configured to generate at least one predetermined voltage;
a reference circuit configured to be written by the at least one predetermined voltage to generate a reference signal;
a readout circuit configured to generate, according to the reference signal and first data, a plurality of data values of second data; and an error correction coding circuit configured to reset the reference circuit when errors occur in all of the data values of the second data.

2. The device of claim 1, wherein the data values correspond to at least two successive bits of the second data.

3. The device of claim 1, wherein when only one error occurs in one of the data values of the second data, the error correction coding circuit is further configured to correct the one of the data values of the second data.

4. The device of claim 1, wherein when errors occur in a first data value and a second data value of the data values of the second data, the error correction coding circuit is further configured to determine whether the first data value and the second data value correspond to two successive bits of the second data, wherein the error correction coding circuit is further configured to reset the reference circuit when the first data value and the second data value correspond to two successive bits of the second data.

5. The device of claim 1, wherein the readout circuit comprises:

a first sense amplifier configured to generate a first data value of the data values of the second data according to a first data value of the first data and the reference signal; and a second sense amplifier configured to generate a second data value of the data values of the second data according to a second data value of the first data and the reference signal.

6. The device of claim 5, wherein the first data value of the second data corresponds to a first bit of a first byte of the second data, and the second data value of the second data corresponds to a first bit of a second byte of the second data.

7. The device of claim 6, wherein when the error occurs in one of the first byte and the second byte, the error correction coding circuit is configured to correct the one of the first byte and the second byte.

8. The device of claim 6, wherein when the errors occur in both of the first byte and the second byte, the error correction coding circuit is further configured to determine whether the errors occur in both of the first data value and the second data value of the second data, and reset the reference circuit when the errors occur in both of the first data value and the second data value of the second data.

9. The device of claim 1, wherein the reference circuit is configured to be written at least one predetermined voltage to generate the reference signal, the error correction coding circuit is configured to generate a control signal to reset the reference circuit when the errors occur in all of the data values, the device further comprises the driver, and the driver is configured to re-write the at least one predetermined voltage to the reference circuit according to the control signal.

10. A device, comprising:

a reference circuit configured to be written by at least one predetermined voltage to generate a reference signal;

a first sense amplifier coupled to a first memory array to receive a first data value of first data, and configured to generate a first data value of second data according to the first data value of the first data and the reference signal;

a second sense amplifier coupled to a second memory array to receive a second data value of the first data, and configured to generate a second data value of the second data according to the second data value of the first data and the reference signal;

an error correction coding circuit configured to generate a control signal when errors occur in both of the first data value and the second data value of the second data; and a driver configured to generate the at least one predetermined voltage, and configured to re-write the at least one predetermined voltage to the reference circuit according to the control signal.

11. The device of claim 10, wherein the first data value of the second data corresponds to a first bit of a first byte of the second data, and the second data value of the second data corresponds to a first bit of a second byte of the second data.

12. The device of claim 10, wherein when an error occurs in one of the first data value of the second data and the second data value of the second data, the error correction coding circuit is further configured to correct the one, having the error, of the first data value and the second data value of the second data.

13. The device of claim 10, wherein the first data value and the second data value of the second data correspond to two successive bits of the second data.

14. A method, comprising:

writing at least one predetermined voltage, by a driver, to a reference circuit to generate a reference signal, wherein the at least one predetermined voltage is generated from the driver;

generating, by a readout circuit according to first data and the reference signal, a first data value and a second data value of second data;

generating, by an error correction coding circuit, a control signal when errors occur in both of the first data value and the second data value of the second data; and resetting, by the driver, the reference circuit according to the control signal.

15. The method of claim 14, wherein the first data value of the second data corresponds to a first bit of a first byte of the second data, the second data value of the second data corresponds to a first bit of a second byte, and the method further comprises:

detecting, by the error correction coding circuit, whether the errors occur in the first byte and the second byte; and correcting, by the error correction coding circuit, one of the first byte and the second byte when only one error occurs in the one of the first byte and the second byte.

16. The method of claim 15, further comprising:

detecting, by the error correction coding circuit, whether the errors occur in the first data value and the second data value of the second data when the errors occur in both of the first byte and the second byte; and correcting, by the error correction coding circuit, the first byte and the second byte when the errors do not occur in one of the first data value and the second data value of the second data.

17. The method of claim 14, wherein the first data value and the second data value of the second data correspond to two successive bits of the second data, and the method further comprises:

detecting, by the error correction coding circuit, whether the errors occur in the first data value and the second data value of the second data; and correcting, by the error correction coding circuit, one of the first data value and the second data value of the second data when only one error occurs in the one of the first data value and the second data value of the second data.

18. The method of claim 14, wherein generating the first data value and the second data value comprises:

generating, by a first sense amplifier of the readout circuit, the first data value of the second data according to a first data value of the first data and the reference signal; and generating, by a second sense amplifier of the readout circuit, the second data value of the second data according to a second data value of the first data and the reference signal.

19. The method of claim 18, further comprising:

transmitting, by a first memory array, the first data value of the first data to the first sense amplifier; and transmitting, by a second memory array, the second data value of the first data to the second sense amplifier.

20. The method of claim 14, wherein resetting the reference circuit comprises:

re-writing, by the driver, the at least one predetermined voltage to the reference circuit according to the control signal.

\* \* \* \* \*